US012622094B2

(12) United States Patent
Li et al.

(10) Patent No.: US 12,622,094 B2
(45) Date of Patent: May 5, 2026

(54) DISPLAY PANEL AND REPAIR METHOD THEREOF

(71) Applicants: CHONGQING HKC OPTOELECTRONICS TECHNOLOGY CO., LTD., Chongqing (CN); HKC CORPORATION LIMITED, Shenzhen (CN)

(72) Inventors: Zeyao Li, Chongqing (CN); Baohong Kang, Chongqing (CN)

(73) Assignees: CHONGQING HKC OPTOELECTRONICS TECHNOLOGY CO., LTD., Chongqing (CN); HKC CORPORATION LIMITED, Shenzhen (CN)

( * ) Notice: Subject to any disclaimer, the term of this patent is extended or adjusted under 35 U.S.C. 154(b) by 750 days.

(21) Appl. No.: 18/064,731

(22) Filed: Dec. 12, 2022

(65) Prior Publication Data

US 2023/0268458 A1      Aug. 24, 2023

(30) Foreign Application Priority Data

Feb. 22, 2022     (CN) .......................... 202210162226.6

(51) Int. Cl.
*H10H 20/01*          (2025.01)
*H10H 20/83*          (2025.01)
                    (Continued)

(52) U.S. Cl.
CPC ............ *H10H 20/01* (2025.01); *H10H 20/83* (2025.01); *H10H 20/857* (2025.01); *H10H 29/142* (2025.01)

(58) Field of Classification Search
CPC ...... H10H 20/01; H10H 20/83; H10H 20/857; H10H 29/142; H01L 25/167;
(Continued)

(56) References Cited

U.S. PATENT DOCUMENTS

| 11,569,270 B2 * | 1/2023 | Xu ......................... H10D 86/60 |
| 11,843,073 B2 * | 12/2023 | Lai ...................... H01L 25/0753 |

(Continued)

FOREIGN PATENT DOCUMENTS

| CN | 113889033 | 1/2022 |
| JP | 2001337307 | 12/2001 |
| WO | 2010044584 | 4/2010 |

OTHER PUBLICATIONS

CNIPA, First Office Action for CN Application No. 202210162226.6, Aug. 31, 2022.
(Continued)

*Primary Examiner* — Victor A Mandala
(74) *Attorney, Agent, or Firm* — Hodgson Russ LLP

(57) ABSTRACT

A display panel is provided with a conductive layer having a conductive connecting line for connecting a light-emitting element. The conductive layer is further provided with a redundant conductive connecting line for connecting a standby light-emitting element. The repair method of the display panel includes: detecting whether the light-emitting element is abnormal; electrically connecting the redundant conductive connecting line with the conductive connecting line when the light-emitting element is abnormal; and connecting the standby light-emitting element to a redundant conductive connecting line to replace the light-emitting element with abnormal function.

18 Claims, 8 Drawing Sheets

(51) Int. Cl.
*H10H 20/857*      (2025.01)
*H10H 29/14*      (2025.01)

(58) Field of Classification Search
CPC ..... H01L 25/0753; H01L 22/14; H01L 22/22; H10P 74/207; H10P 74/232; Y02W 30/82
See application file for complete search history.

(56)          References Cited

U.S. PATENT DOCUMENTS

| | | | |
|---|---|---|---|
| 12,015,103 B2 * | 6/2024 | Lo ........................ | H01L 25/0753 |
| 2019/0393389 A1 * | 12/2019 | Chen ................... | H01L 25/0753 |
| 2020/0194370 A1 * | 6/2020 | Radauscher .......... | H01L 23/528 |
| 2022/0302174 A1 * | 9/2022 | Ruan .................... | H01L 25/167 |
| 2023/0102061 A1 * | 3/2023 | Watsuda ............... | H01L 23/525 |
| | | | 257/773 |
| 2023/0140197 A1 * | 5/2023 | Chen ................... | H01L 25/0753 |
| | | | 257/79 |
| 2023/0253388 A1 * | 8/2023 | Chung ................. | H01L 25/167 |
| | | | 345/204 |
| 2024/0192909 A1 * | 6/2024 | Chen ........................ | G06F 3/147 |
| 2024/0355988 A1 * | 10/2024 | Wu ..................... | H10H 20/857 |

OTHER PUBLICATIONS

CNIPA, Second Office Action for CN Application No. 202210162226.6, Nov. 11, 2022.

* cited by examiner

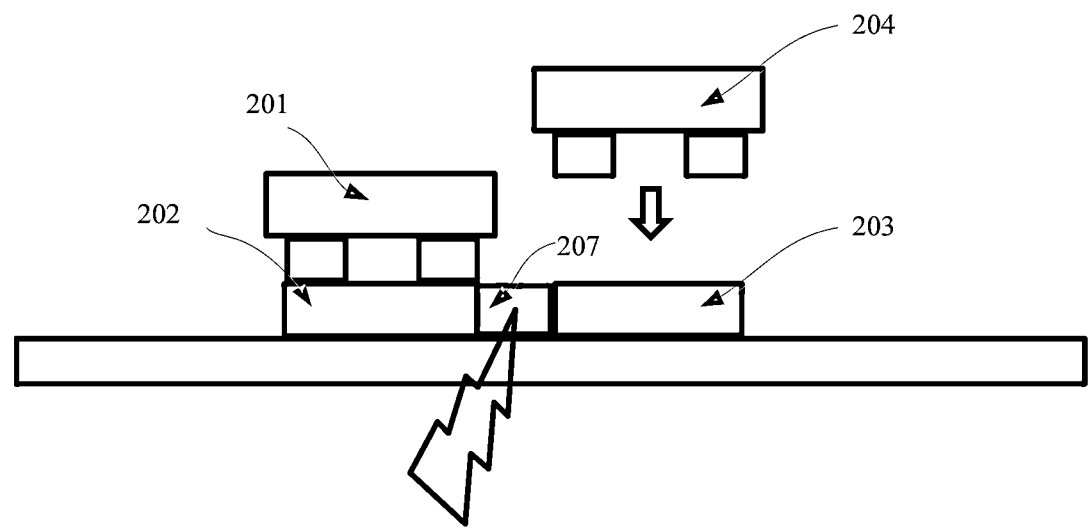

Disconnecting Conductive Connecting Line 202 from Light-Emitting Element 201 With Abnormal Function by Laser Cutting

S520

Electrically Connecting Redundant Conductive Connecting Line 203 to Conductive Connecting Line 202 by Laser

S530

Connecting Standby Light-Emitting Element 204 to Redundant Conductive Connecting Line 203 to Replace Light-Emitting Element 201 with Abnormal Function

DISPLAY PANEL AND REPAIR METHOD THEREOF

CROSS-REFERENCE TO RELATED APPLICATIONS

This application claims priority to Chinese Patent Application No. 202210162226.6, filed Feb. 22, 2022, the entire disclosure of which is incorporated herein by reference.

FIELD OF TECHNOLOGY

The present disclosure relates to the technical field of display panels, more particularly, to a display panel and a repair method of the display panel.

BACKGROUND

With the vigorous development of display industry, Micro LED, as a new generation display technology, has stepped onto the stage of the times. Compared with the existing OLED and LCD technology, Micro LED has higher brightness, lower power consumption and longer service life. However, there are still many problems to be solved at present, the current process technology, inspection standards or manufacturing costs of the micro-LED are far from the purpose of mass production and commercial application. Repair technology is a difficult point in the display industry.

FIGS. 1a and 1b show a repair method of a Micro LED display panel in tradition. FIG. 1a shows a schematic diagram of removing a light-emitting element with abnormal function in tradition, and FIG. 1B shows a schematic diagram of a replacement of standby light-emitting element in tradition. As shown in FIGS. 1a and 1b, there are at least three light-emitting elements on the substrate, and the three light-emitting elements may be tri-phosphor LEDS, for example, the light-emitting element 201*a*' emits red light, the light-emitting element 201*b*' emits green light, and the light-emitting element 201*c*'emits blue light. The traditional repair method is to remove the light-emitting element 201*a*' with abnormal function and replace with a new standby light-emitting element 204', in which two processes of removal and replacement are involved. However, since the removal of the light-emitting element requires performing operation on the bottom of the light-emitting element, it is difficult to implement the operation without affecting other light-emitting elements and conductive lines.

Therefore, there is an urgent need for a simpler and more effective method to repair the display panel.

The above information disclosed in the Background is only for enhancement of understanding of the background of the present disclosure and therefore it may include information that does not constitute prior art known to a person of ordinary skill in the art.

SUMMARY

There are provided a display panel and a repair method for the display panel according to embodiments of the present disclosure. The technical solution is as below:

According to a first aspect of the present disclosure, there is provided a repair method of a display panel provided with a conductive layer having a conductive connecting line for connecting light-emitting element, the conductive layer is further provided with a redundant conductive connecting line for connecting a standby light-emitting element, and the method includes detecting whether he light-emitting element is abnormal; electrically connecting the redundant conductive connecting line with the conductive connecting line when the light-emitting element is abnormal; and connecting the standby light-emitting element to a redundant conductive connecting line to replace the light-emitting element with abnormal function.

According to a second aspect of the present disclosure, there is also provided a display panel, having a conductive layer including a conductive connecting line for electrically connecting with a light-emitting element, the conductive layer further includes: a redundant conductive connecting line disconnected from the conductive connecting line through a spacer, the redundant conductive connecting line being configured for connecting a standby light-emitting element. The redundant conductive connecting line is electrically connecting the redundant conductive connecting line with the conductive connecting line when the light-emitting element is abnormal. A standby light-emitting element is connected to the redundant conductive connecting line to replace the light-emitting element with abnormal function.

It should be understood that the above general description and the following detailed description are exemplary only and are not limiting to the present disclosure.

BRIEF DESCRIPTION OF THE DRAWINGS

The above and other objects, features and advantages of the present disclosure will become more apparent by describing exemplary embodiments thereof in detail with reference to the accompanying drawings.

FIG. 4 is a sectional view of a conductive layer according to a third embodiment of the present disclosure.

FIG. 5 is a flowchart of a repair method of a display panel according to a fourth embodiment of the present disclosure.

DETAILED DESCRIPTION OF THE EMBODIMENTS

Figure 1A:
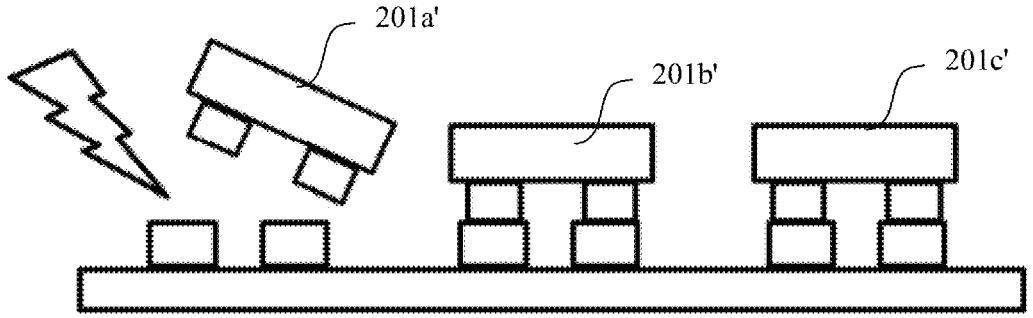
FIG. 1a shows a schematic diagram of removing a light-emitting element with abnormal function in tradition.
Figure 1B:
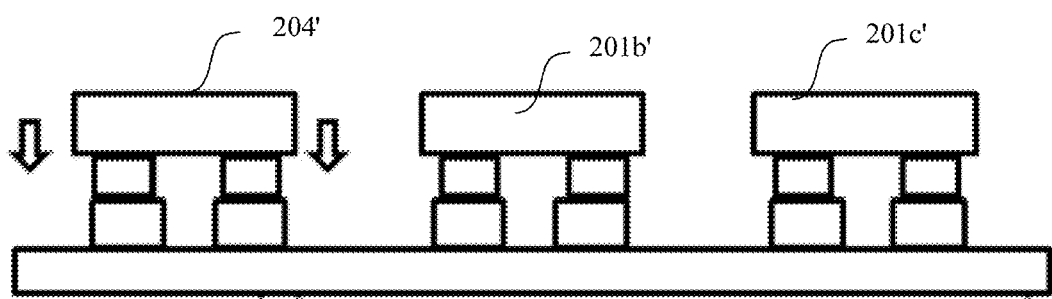
FIG. 1B shows a schematic diagram of a replacement of standby light-emitting element in tradition.

Although the present disclosure can readily be embodied in different forms of embodiment, however, only some of the specific embodiments are shown in the drawings and will be described in detail in the description, while it is understood that the description is to be regarded as an exemplary illustration of the principles of the present disclosure and is not intended to limit the present disclosure to those described herein.

Thus, one feature pointed out in the description is intended to illustrate one of the features of one embodiment of the present disclosure and is not intended to imply that each embodiment of the present disclosure must possess the illustrated feature. In addition, it should be noted that many features are described in the description. Although certain features may be combined to illustrate a possible system design, these features may also be used for other unspecified combinations. Therefore, unless otherwise stated, the illustrated combinations are not intended to be limiting.

In the embodiments illustrated in the drawings, indications of direction (such as up, down, left, right, front and back) are used to explain that the structure and movement of the various elements of the present disclosure are not absolute but relative. These descriptions are appropriate when these elements are in the positions shown in the drawings. If the description of the positions of the element changes, the indications of the directions change accordingly.

Exemplary embodiments will now be described more comprehensively with reference to the accompanying drawings. However, the exemplary embodiments can be implemented in a variety of forms and should not be construed as being limited to the examples set forth herein. Rather, these exemplary embodiments are provided so that the description of the present disclosure will be more comprehensive and complete, and the concept of exemplary embodiments will be fully connected to those skilled in the art. The accompanying drawings are only schematic illustrations of the present disclosure and are not necessarily drawn to scale. Like reference signs in the drawings denote identical or similar parts and thus repetitive descriptions thereof will be omitted.

The preferred embodiments of the present disclosure are further elaborated below in conjunction with the accompanying drawings of the description.

The structure of the display panel needs to be firstly described. The display panel has a substrate on which a plurality of pixel units are provided, and a plurality of light-emitting elements are provided in one pixel unit. The substrate may include, but is not limited to, a hard substrate or a flexible substrate, such as a glass substrate or a plastic substrate.

Light-emitting elements are used to provide lights of different colors, and the light-emitting elements can be arranged in an array, and the lights of different colors provided by the light-emitting elements are mixed to achieve the effect of full-color display. For example, the light-emitting elements provide red, blue and green light, respectively. That is, the light-emitting element is a micro LED for emitting red, blue or green light.

A conductive layer is formed on the substrate. The conductive layer is provided with a conductive connecting line, which is used for connecting the light-emitting element and a driving element corresponding to the light-emitting element to transmit a driving signal through the conductive connecting line. The driving element may include a thin film transistor. In a display device, a gate of the thin film transistor is connected to a horizontal scanning line, a source of the thin film transistor is connected to a data line in a vertical direction, and a drain of the thin film transistor is connected to each light-emitting element through the conductive connecting line. Applying sufficient voltage to the horizontal scanning line causes the thin film transistor electrically connected to the horizontal scanning line to be turned on, so that the signal voltage on the data line can be transmitted to the light-emitting element, which controls the display device for image display.

The present disclosure improves the conductive connecting line in the conductive layer for improving the repair efficiency of the display panel.

Figure 2:
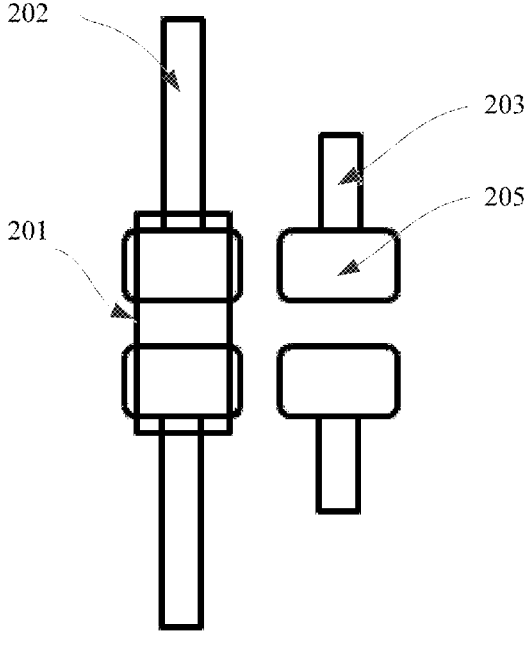
FIG. 2 is a structural diagram of a conductive layer according to a first embodiment of the present disclosure.

FIG. 2 is a structural diagram of a conductive layer according to a first embodiment of the present disclosure.

As shown in FIG. 2, the conductive layer has a conductive connecting line 202 to which the light-emitting element 201 is connected and a redundant conductive connecting line 203. The redundant conductive connecting line 203 is used to connect the standby light-emitting element. Specifically, the redundant conductive connecting line 203 is provided close to the conductive connecting line 202 but is not in contact with the conductive connecting line 202. In other words, the redundant conductive connecting line 203 is not electrically connected to the conductive connecting line 202. A connecting position for the standby light-emitting element may be formed on the redundant conductive connecting line 203 to facilitate connection of the standby light-emitting elements.

In one embodiment, as shown in FIG. 2, electrodes 205 may also be formed on the redundant conductive connecting line for mounting the standby light-emitting element. The electrode 205 may include a non-transparent conductive material such as silver, aluminum, copper or molybdenum, or a transparent conductive material including alumina, or a composite or alloy of the above materials. Two electrodes constitute a connecting position for the standby light-emitting element, so that the standby light-emitting element can be connected to the connecting position for the standby light-emitting element to form electrical connection, thereby enabling replacement. It should be noted that a pair of electrodes 205 may be provided to form a loop, thereby facilitating the normal operation of the standby light-emitting element.

Figure 3:
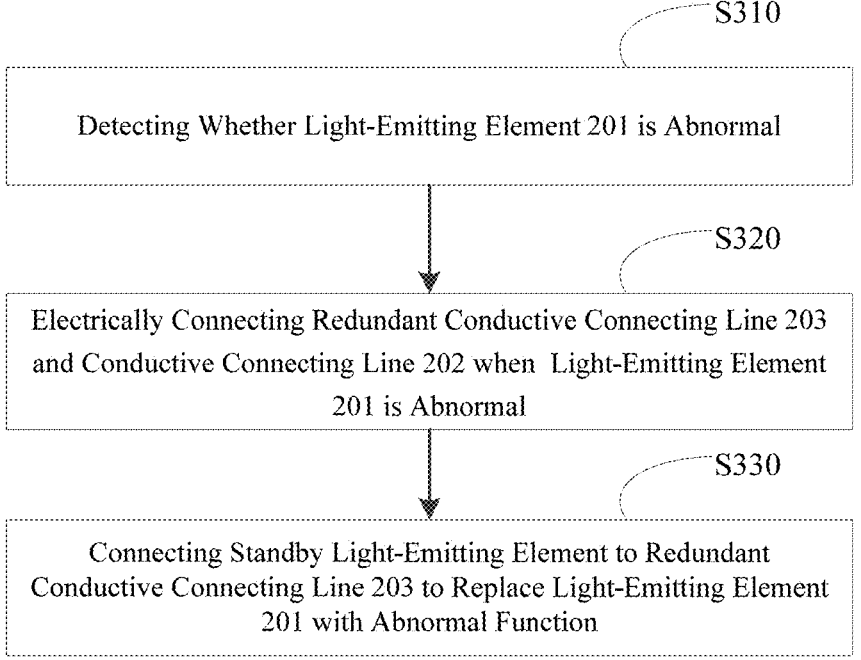
FIG. 3 is a flowchart of a repair method of a display panel according to a second embodiment of the present disclosure.

FIG. 3 is a flowchart of a repair method of a display panel according to a second embodiment of the present disclosure. The method shown in this embodiment can be applied to repairing the display panel having the conductive layer structure shown in FIG. 2. As shown in FIG. 3, in which the repair method of the display panel includes at least the following three steps S310 to S330.

In step S310, it is detected whether the light-emitting element 201 is abnormal.

In step S320, when the light-emitting element 201 is abnormal, the redundant conductive connecting line 203 is electrically connected to the conductive connecting line 202.

In step S330, the redundant conductive connecting line 203 is connected to the standby light-emitting element to replace the light-emitting element 201 with abnormal function.

Specifically, the light-emitting element 201 can be detected by an electrical or optical technical means. Schematically, it is possible to determine whether there is an abnormality in the function of the light-emitting element 201 by setting a voltage signal to the light-emitting element 201 and obtaining the light-emitting condition of the light-emitting element 201.

When it is detected that there is an abnormality in the function of the light-emitting element 201 connected to the conductive connecting line 202, the redundant conductive connecting line 203 is electrically connected to the conductive connecting line 202, and the redundant conductive connecting line 203 is connected to the standby light-emitting element, so that the standby light-emitting element is used to emit light instead of the light-emitting element of the light-emitting element 201 with abnormal function, and the display panel works normally.

Therefore, compared with the repair method of removing and replacing the light-emitting element in tradition, the method provided in the present disclosure only requires connecting the conductive connecting line 202 with the redundant conductive connecting line 203 and connecting a new standby light-emitting element with the redundant conductive connecting line 203, so that the operation difficulty is small and the success rate is high, thereby improving the repair efficiency.

FIG. 4 is a sectional view of a conductive layer according to a third embodiment of the present disclosure. As shown in FIG. 4, in this embodiment, a spacer 207 is provided between the conductive connecting line 202 and the redundant conductive connecting line 203. The spacer 207 may be composed of a thermally-fused insulating material.

Specifically, the light-emitting element 201 is connected to its corresponding driving element through the conductive connecting line 202. The redundant conductive connecting line 203 is disconnected from the conductive connecting line 202 through the spacer 207. In other words, the redundant conductive connecting line 203 is disposed close to the conductive connecting line 202 but does not form an electrical connection.

The spacer 207 may be melted by laser while the light-emitting element 201 is abnormal, so that an electrical fusion point is formed at the position where the spacer is, and the redundant conductive connecting line 203 is electrically connected to the conductive connecting line 202 through the electrical fusion point. Therefore, the redundant conductive connecting line 203 is electrically connected to the original driving element through the fusion point, and then a standby light-emitting element 204 can be installed on the redundant conductive connecting line 203 to replace the light-emitting element 201 with abnormal function.

Since a surface area of each light-emitting element on the display panel is insignificant, the original light-emitting element 201 can be replaced by the standby light-emitting element 204 newly installed in a position adjacent to the original light-emitting element 201, so that the display panel can be repaired reliably and conveniently by this repair method.

FIG. 5 is a flowchart of a repair method of a display panel according to a fourth embodiment of the present disclosure. The method in this embodiment can be applied to repairing the display panel having the conductive layer structure shown in FIGS. 2-4. As shown in FIG. 5, in this embodiment, the repair method of the display panel may include at least the following steps S510 to S530.

In step S510, the conductive connecting line 202 is disconnected from the light-emitting element 201 with abnormal function by laser cutting.

In step S520, the redundant conductive connecting line 203 is electrically connected with the conductive connecting line 202 by laser.

In step S530, the standby light-emitting element 204 is connected to the redundant conductive connecting line 203 to replace the light-emitting element 201 with abnormal function.

Figure 6:
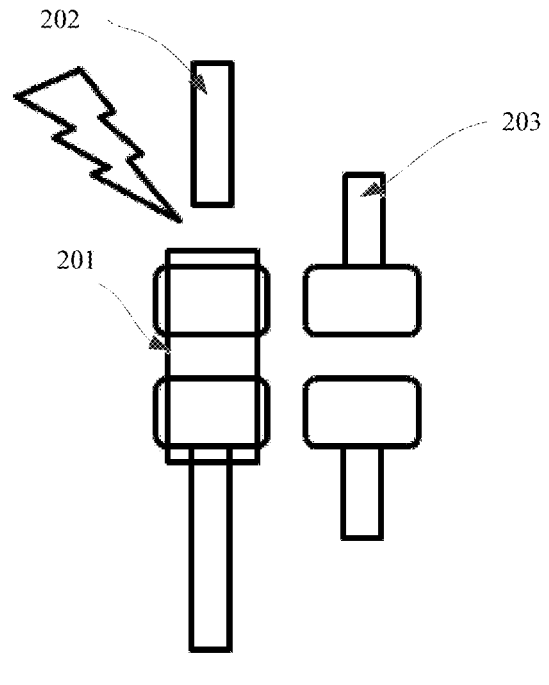
FIG. 6 shows an operational schematic diagram of step S510 in FIG. 5.
Figure 7:
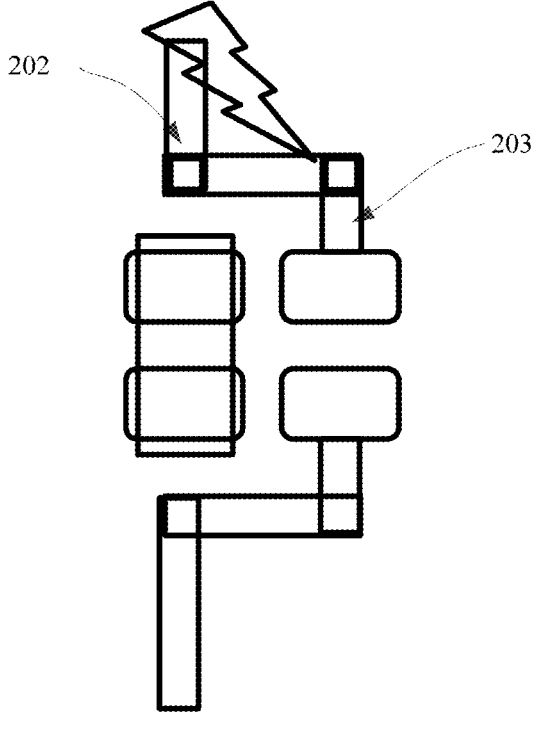
FIG. 7 shows an operational schematic diagram of step S520 in FIG. 5.
Figure 8:
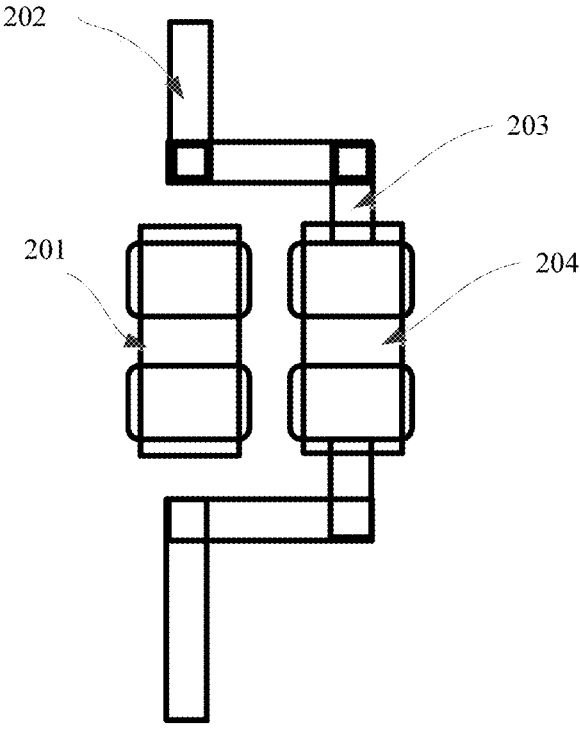
FIG. 8 shows an operational schematic diagram of step S530 in FIG. 5.

More specifically, please refer to FIGS. 6 to 8, FIG. 6 shows a schematic operation of step S510 in FIG. 5, FIG. 7 shows an operational schematic diagram of step S520 in FIG. 5, and FIG. 8 shows an operational schematic diagram of step S530 in FIG. 5.

As shown in FIG. 6, in step S510, the conductive connecting line 202 is disconnected from the light-emitting element 201 with abnormal function by using laser. Since the position of the laser cutting is located on the side of the light-emitting element 201 rather than the lower side, only the conductive connecting line 202 needs to be cut, and therefore a high cutting success rate is achieved.

As shown in FIG. 7, in step S520, the redundant conductive connecting line 203 is electrically connected to the conductive connecting line 202 by laser, so that the redundant conductive connecting line 203 can be connected to a driving element for driving an abnormal light-emitting element in the display panel.

In an embodiment, referring to the conductive layer structure shown in FIG. 4, electrically connecting the redundant conductive connecting line to the conductive connecting line by laser may include: melting the spacer 207 by laser until the redundant conductive connecting line 202 on one side of the spacer 207 is electrically connected to the redundant conductive connecting line 203 on the other side of the spacer 207.

Specifically, the conductive connecting line and redundant conductive connecting line are usually made of materials with good conductivity, such as metals, alloys or metal oxides. The spacer is made of an insulating material, which may include an inorganic material such as silicon oxide, silicon nitride, silicon oxynitride or alumina, or other suitable organic or inorganic materials. After the spacer and the conductive connecting lines near the spacer are irradiated by laser with appropriate energy, they will melt and become sticky and adhere to each other, thereby achieving electrical communication.

As shown in FIG. 8, in step S530, connecting the standby light-emitting element 204 to the redundant conductive connecting line 203 to replace the light-emitting element 201 with abnormal function may specifically include connecting the standby light-emitting element to the electrode 205 to form the electrical connection. More specifically, a conductive adhesive layer having a meltable characteristic may be formed on the standby light-emitting element, so that a thermal process may be used to melt the conductive adhesive layer, thereby adhering the standby light-emitting element to the electrode and forming an electrical connection. In another embodiment, a conductive adhesive layer may also be formed on the electrode and melted to connect the standby light-emitting element. The conductive adhesive layer may be a conductive adhesive or other suitable conductive material, and the conductive material may include at least one of indium (In), bismuth (Bi), tin (Sn), silver (Ag), gold, copper, gallium (Ga) and antimony (Sb).

Therefore, the abnormal light-emitting element can be efficiently replaced by cutting off the conductive connecting line and connecting the redundant standby light-emitting element, and the success rate of the whole operation is high, thereby improving the repair success rate and solving the abnormal luminous problem caused by short circuit of the bonding layer of the abnormal light-emitting element.

The conductive layer can be a single layer or multiple layers. In one embodiment, the conductive layer may be formed below: forming a patterned conductive layer on a substrate of the display panel. The conductive layer includes a first conductive layer and a second conductive layer.

Figure 9:
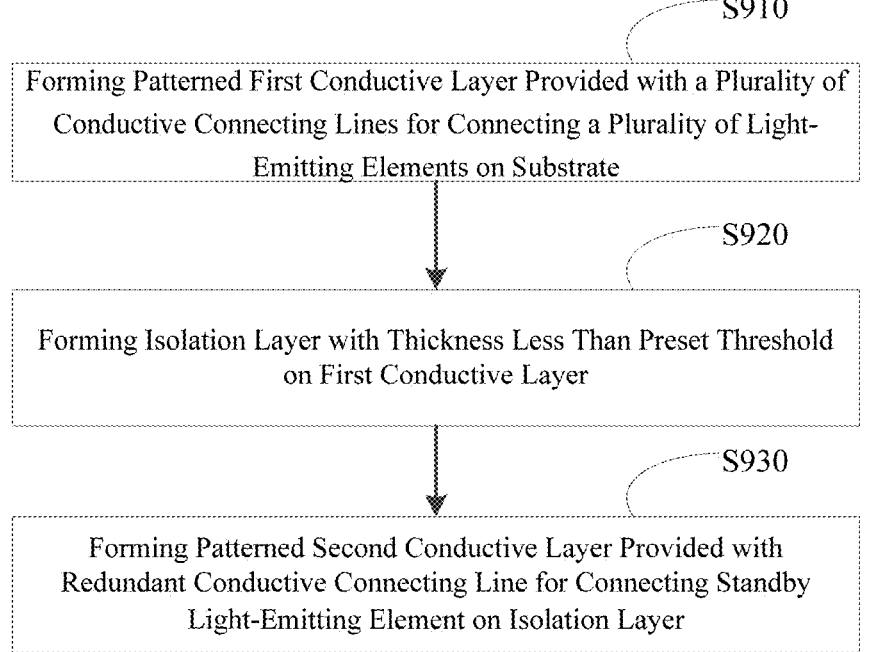
FIG. 9 is a flowchart of a formation process of a conductive layer according to a fifth embodiment of the present disclosure.

FIG. 9 is a flowchart of a formation process of a conductive layer according to a fifth embodiment of the present disclosure. As shown in FIG. 9, in this embodiment, the formation process of the conductive layer may specifically include the following steps S910 to S930.

In step S910, a patterned first conductive layer is formed on the substrate, and the first conductive layer has a plurality of conductive connecting lines for connecting a plurality of light-emitting elements.

In step S920, an isolation layer with a thickness less than a preset threshold is formed on the first conductive layer.

In step S930, a patterned second conductive layer is formed on the isolation layer, and the second conductive layer has redundant conductive connecting lines for connecting the standby light-emitting elements. Specifically, the conductive layer are firstly patterned to form a set of conductive lines, which can be formed by printing, pasting, or the like, in a desired pattern on the substrate, so that an electrical signal can be conducted according to the needs of the display panel.

In an embodiment, the first conductive layer may be formed first, then, the isolation layer with a thickness less than a preset threshold value can be formed on the first conductive layer. The isolation layer is composed of an insulating material. Finally, the patterned second conductive layer is formed on the isolation layer, so that the conductive line in the first conductive layer and the redundant conductive connecting line in the second conductive layer are not electrically connected with each other due to the existence of the isolation layer.

The redundant conductive connecting lines and the conductive connecting line can be interleaved, so that laser thermal fusion can be carried out at the interleaved position, and the redundant conductive connecting line and the conductive connecting line are electrically connected.

As previously described, the redundant conductive connecting line is used to connect the standby light-emitting element, and in this embodiment, the standby light-emitting element to which the redundant conductive connecting line is connected may replace the light-emitting elements with abnormal function connected on the conductive connecting line interleaved therewith.

In one embodiment, the isolation layer can also be patterned, and the pattern of the isolation layer is adapted to the wire pattern of the first conductive layer, so that on the one hand, the first conductive layer can be protected from the damage of the subsequent process, on the other hand, the first conductive layer and the second conductive layer are isolated, and it is easy to achieve the electrical connection between the redundant conductive connecting line and the conductive connecting line.

In another embodiment, the first conductive layer and the second conductive layer can also be simultaneously formed on the substrate, thereby fixing the relative positions of the conductive connecting lines and the redundant conductive connecting lines, reducing the operation steps and reducing the cost.

Figure 10:
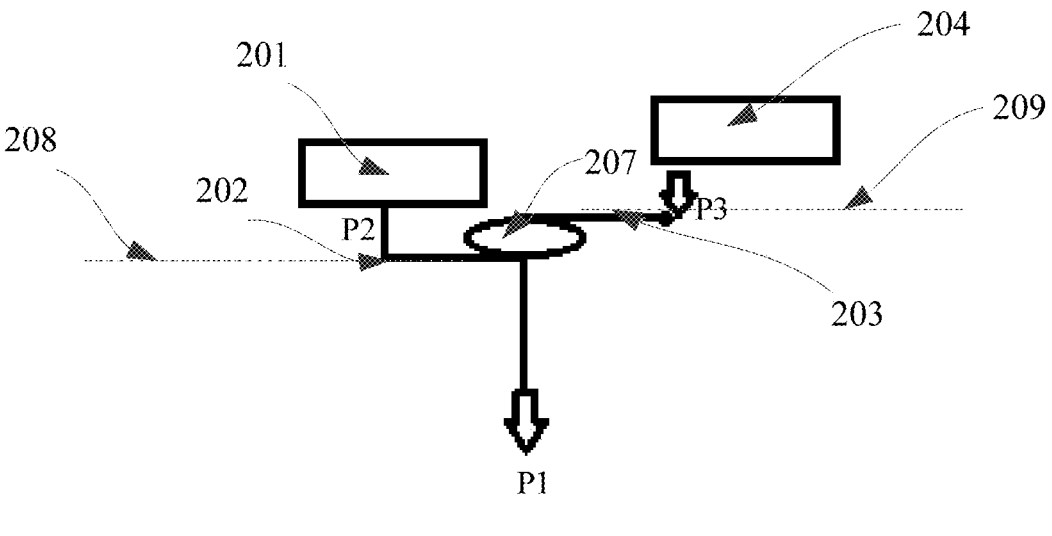
FIG. 10 is a structural diagram of a conductive layer according to a sixth embodiment of the present disclosure.

FIG. 10 is a structural diagram of a conductive layer according to a sixth embodiment of the present disclosure. As shown in FIG. 10, the conductive layer includes a first conductive layer 208 and a second conductive layer 209. Specifically, the first conductive layer 208 has a conductive connecting line 202, and the second conductive layer 209 has a redundant conductive connecting line 209. The conductive connecting line 202 has a P1 end connected to the driving element corresponding to the light-emitting element 201 and a P2 end connected to the light-emitting element 201. A P3 end is formed on the redundant conductive connecting line 209 for connection of the standby light-emitting element 204. There is an isolation layer between the first conductive layer 208 and the second conductive layer 209, and the isolation layer may be in the form of single, mutually independent spacers 207, or may be in the form of a whole layer.

In this embodiment, the first conductive layer 208 and the second conductive layer 209 are separated by the isolation layer, so that the conductive lines in the first conductive layer 208 and the conductive lines in the second conductive layer 209 can be layered and separated. It is ensured that the two layers can't be communicated with each other when the light-emitting element 201 works normally. The thickness of the isolation layer is less than a preset threshold value, so that when the light-emitting element 201 is abnormal, the P3 end of the redundant conductive connecting line 209 and the P1 end of the conductive connecting line 202 can be electrically connected by thermally melting the spacer 207 by laser, so that the standby light-emitting element 204 can replace the light-emitting element 201 that is abnormal.

In an embodiment, the first conductive layer 208 may be located underneath the second conductive layer 209. Since the first conductive layer 208 has a relatively large number of conductive connecting lines and the spacer 207 is located at an upper side of the first conductive layer 208, the convenience and safety of laser thermal melting can be improved, and the repair efficiency can be improved.

In an embodiment, the first conductive layer may have a plurality of conductive connecting lines, and the second conductive layer may have at least one redundant conductive connecting line, the redundant conductive connecting line and the conductive connecting line are interleaved. A redundant conductive connecting line can be interleaved with one conductive connecting line or a plurality of conductive connecting lines, so as to improve the repair flexibility.

Figure 11:
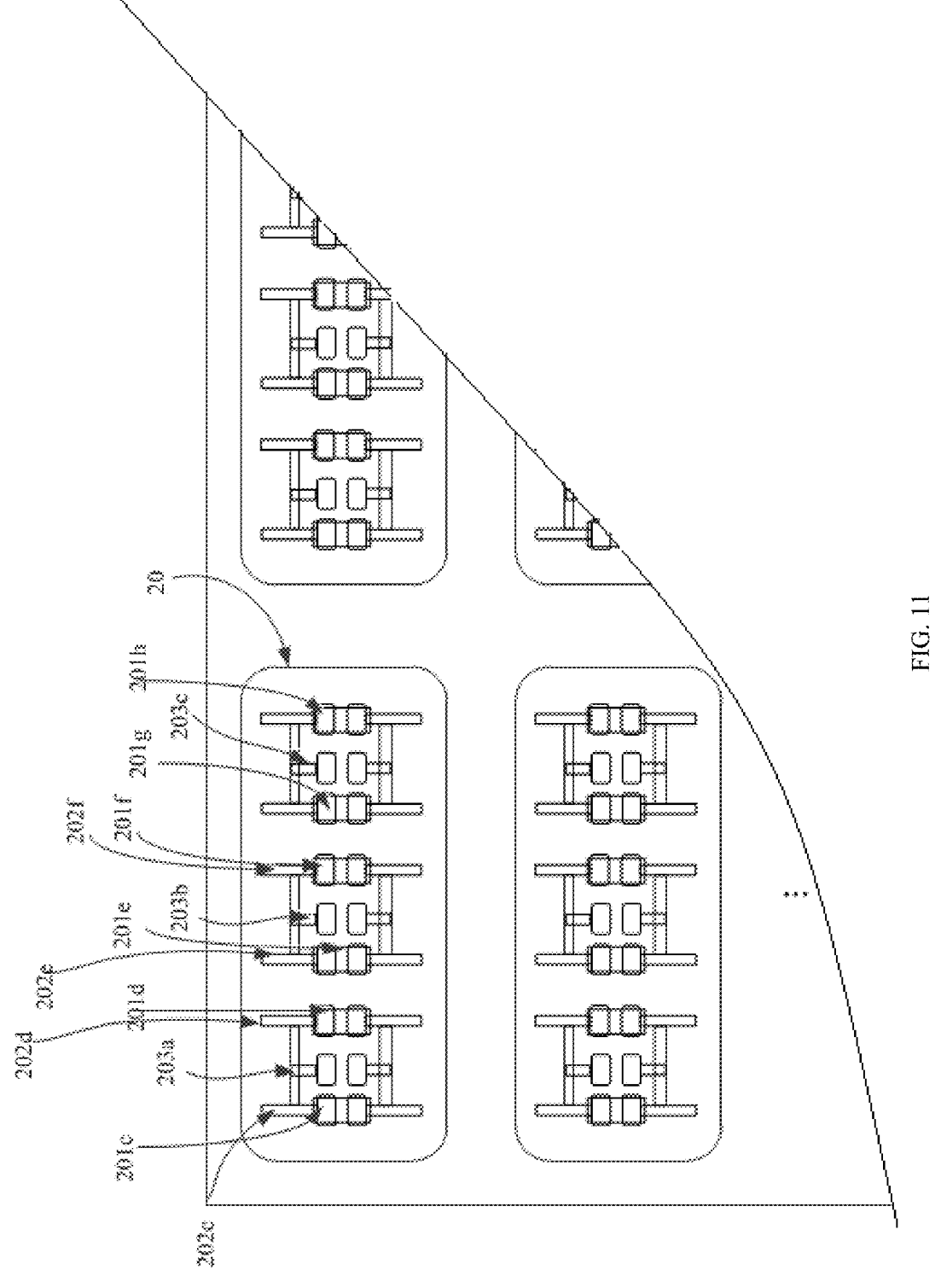
FIG. 11 is a structural diagram of a display panel (part) according to a seventh embodiment of the present disclosure.

FIG. 11 is a structural diagram of a display panel (part) according to a seventh embodiment of the present disclosure. As shown in FIG. 11, a plurality of pixel units 20 are provided on a substrate, and a plurality of light-emitting elements may be provided in one pixel unit 20. In this embodiment, six light-emitting elements are provided in one pixel unit, specifically a third light-emitting element 201c, a fourth light-emitting element 201d, a fifth light-emitting element 201e, a sixth light-emitting element 201f, a seventh light-emitting element 201g, and an eighth light-emitting element 201h. The light-emitting elements 201c to 201h are respectively connected to their corresponding driving thin film transistors through their corresponding conductive connecting lines. In this embodiment, two of the six light-emitting elements emit red light, two of the six light-emitting elements emit blue light, and two of the six light-emitting elements emit green light to achieve a full-color display effect. The light-emitting elements that generate light of different colors may be arranged in sequence, and schematically, the third light-emitting elements 201c and the sixth light-emitting elements 201f emit red light, the fourth light-emitting elements 201d and the seventh light-emitting elements 201g emit blue light, and the fifth light-emitting elements 201e and the eighth light-emitting elements 201h emit green light.

The conductive layer also includes a first redundant conductive connecting line 203a, a second redundant conductive connecting line 203b and a third redundant conductive connecting line 203c. The first redundant conductive connecting line 203a is disconnected from the third conductive connecting line 202c corresponding to the third light-emitting element 201c and the fourth conductive connecting line 202d corresponding to the fourth light-emitting element 201*d* through the spacer. In a similar fashion, the second redundant conductive connecting line 203*b* is disconnected from the fifth conductive connecting line 202*e* corresponding to the fifth light-emitting element 201*e* and the sixth conductive connecting line 202*f* corresponding to the sixth light-emitting element 201*f* through the spacer. The third redundant conductive connecting line 203*c* is also arranged in a corresponding manner. The redundant conductive connecting line is used for connecting the standby light-emitting element.

Schematically, in the case where the third light-emitting element 201*c* is abnormal, the third redundant conductive connecting line 203*c* may be electrically connected to the third conductive connecting line 202*c* by laser melting the spacer between the first redundant conductive connecting line 203*a* and the third conductive connecting line 202*c* corresponding to the third light-emitting element 201*c*, so that the third redundant conductive connecting line 203*c* can be connected to the operating circuit of the display panel. A standby light-emitting element is provided to be connected to the first redundant conductive connecting line 203*a* so that the standby light-emitting element works instead of the third light-emitting element 201*c*.

Since the area of the pixel unit on the display panel is tiny, the tiny displacement of some light-emitting elements is difficult to be detected by human eyes, so the display panel can be repaired by this repair method.

In some embodiments, the conductive layer includes a conductive connecting line and a redundant conductive connecting line, and an insulating medium is formed between the conductive connecting line and the redundant conductive connecting line. The conductive connecting line and the redundant conductive connecting line are interleaved within the insulating medium so that the insulating medium corresponding to an interleaved position forms a spacer. The spacer is capable of being melted by laser, and the redundant conductive connecting line is electrically connected to the conductive connecting line. The redundant conductive connecting lines can be interleaved with one conductive connecting line or with a plurality of conductive connecting lines. When the redundant conductive connecting lines are interleaved with a plurality of conductive connecting lines, the redundant conductive connecting lines are provided with an interleaving position corresponding to each conductive connecting line. An insulating medium can be arranged on the interleaving position. On the one hand, the insulating medium can make the conductive connecting line work normally without being affected by the redundant conductive connecting line. On the other hand, when the light-emitting element connected by the conductive connecting line is abnormal, the redundant conductive connecting line can be electrically connected to the conductive connecting line by laser thermal melting.

In an embodiment, connecting positions for the standby light-emitting elements are formed on redundant conductive connecting lines. The display panel is provided with a plurality of pixel units. The pixel unit is provided with a plurality of the light-emitting elements and at least one connecting position for the standby light-emitting element through which the standby light-emitting element is connected to replace the light-emitting element with abnormal function when any of the light-emitting elements is abnormal.

In particular, the connecting position for the standby light-emitting element is arranged between the at least two light-emitting elements so that the at least two light-emitting elements can share the connecting position for the standby light-emitting element.

Figure 12:
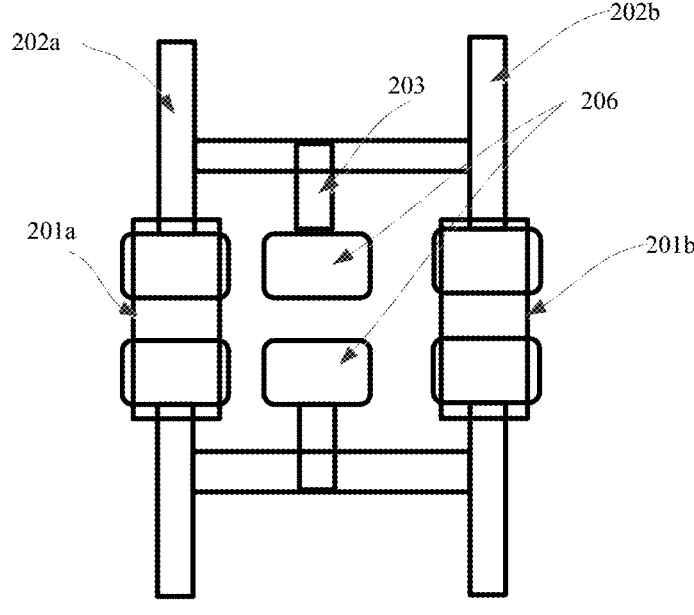
FIG. 12 is a schematic diagram of a configuration in which two light-emitting elements share a connecting position for a standby light-emitting element according to an eighth embodiment of the present disclosure.

FIG. 12 is a schematic diagram of a configuration in which two light-emitting elements share a connecting position for a standby light-emitting element according to an eighth embodiment of the present disclosure.

As shown in FIG. 12, the conductive connecting line 202 includes a first conductive connecting line 202*a* and a second conductive connecting line 202*b*, and the light-emitting element 201 includes a first light-emitting element 201*a* and a second light-emitting element 201*b*. The first conductive connecting line 202*a* is connected to the first light-emitting element 201*a*. The second conductive connecting line 202*b* is connected to the second light-emitting element 201*b*.

A connecting position 206 for the standby light-emitting element is provided between the first light-emitting element 201*a* and the second light-emitting element 201*b*. Both ends of connecting position 206 for the standby light-emitting element are connected to the redundant conductive connecting line 203. The redundant conductive connecting line 203 is spaced from the first conductive connecting line 202*a* and the second conductive connecting line 202*b*. That is, the spacer is located between the first conductive connecting line 202*a* (or the second conductive connecting line 202*b*) and the redundant conductive connecting line 203. Since the spacers are made of insulating materials, the redundant conductive connecting lines 203 are not electrically connected with the first conductive connecting lines 202*a* and the second conductive connecting lines 202*b*, thereby replacing any abnormality of the first light-emitting elements 201*a* and the second light-emitting elements 201*b*, so as to improve the flexibility of repair.

Figure 13:
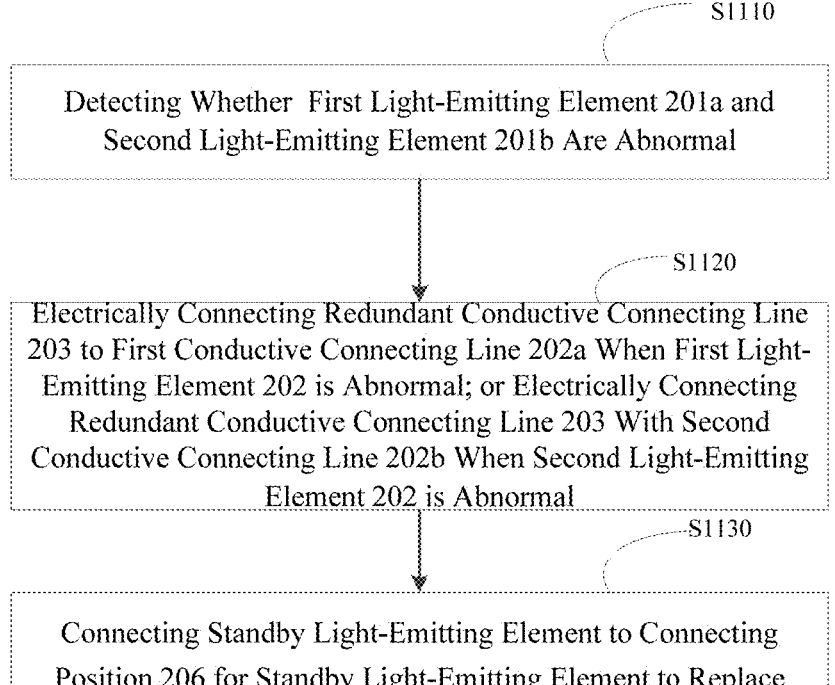
FIG. 13 is a flowchart of a repair method of a display panel according to a ninth embodiment of the present disclosure.

FIG. 13 is a flowchart of a repair method of a display panel according to a ninth embodiment of the present disclosure. The repair method in this embodiment can be applied to the display panel of the embodiment shown in FIG. 12, in which the repair method of the display panel includes at least steps S1110 to S1130, as shown in FIG. 13.

In step S1110, it is detected whether the functions of the first light-emitting element 201*a* or the second light-emitting element 201*b* is abnormal.

In step S1120, when the first light-emitting element 201*a* is abnormal, the redundant conductive connecting line 203 is electrically connected to the first conductive connecting line 202*a*; or when the second light-emitting element 201*b* is abnormal, the redundant conductive connecting line 203 is electrically connected to the second conductive connecting line 202*b*.

In step S1130, the standby light-emitting element is connected to connecting position 206 for the standby light-emitting element to replace the light-emitting element with abnormal function.

Therefore, two light-emitting elements can share one standby light-emitting element, thereby reducing the number of elements on the display panel and lowering the cost. Since the method provided in the present disclosure only needs to connect the conductive connecting line with the redundant conductive connecting line 203, and connects a new standby light-emitting element on the redundant conductive connecting line 203, and is convenient for a plurality of light-emitting elements to share the connecting position for the standby light-emitting element, compared with the repair method of cutting and replacing the light-emitting element in tradition, the operation difficulty is small, the operation success rate is high, and the repair efficiency can be improved.

While the present disclosure has been described with reference to several exemplary embodiments, it should be understood that the terms used herein are illustrative and exemplary and are not limiting. Since the present disclosure can be embodied in various forms without departing from the spirit or essence of the invention, it should therefore be understood that the foregoing embodiments are not limited to any of the foregoing details, but are to be interpreted broadly within the spirit and scope defined by the appended claims, so that all variations and modifications falling within the scope of the claims or their equivalents are to be covered by the appended claims.

What is claimed is:

1. A repair method of a display panel, wherein the display panel is provided with a conductive layer having a conductive connecting line for connecting a light-emitting element, wherein the conductive layer is further provided with a redundant conductive connecting line for connecting a standby light-emitting element, and the method comprises:
detecting whether the light-emitting element is abnormal;
electrically connecting the redundant conductive connecting line with the conductive connecting line when the light-emitting element is abnormal; and
connecting the standby light-emitting element to the redundant conductive connecting line to replace the light-emitting element with abnormal function;
wherein the redundant conductive connecting line is disconnected from the conductive connecting line through a spacer, and the electrically connecting the redundant conductive connecting line with the conductive connecting line comprises:
melting the spacer by laser until the redundant conductive connecting line on either side of the spacer is electrically connected with the conductive connecting line on another side of the spacer.

2. The method according to claim 1, wherein before detecting whether the light-emitting element is abnormal, the method further comprises:
forming a patterned conductive layer on a substrate corresponding to the display panel, wherein the conductive layer comprises a first conductive layer provided with a plurality of conductive connecting lines and a second conductive layer provided with the redundant conductive connecting line, the redundant conductive connecting line being interleaved with the conductive connecting line.

3. The method according to claim 2, wherein the forming a patterned conductive layer on a substrate corresponding to the display panel comprises:
forming a patterned first conductive layer on the substrate corresponding to the display panel;
forming an isolation layer on the first conductive layer; and
forming a patterned second conductive layer on the isolation layer.

4. The method according to claim 1, wherein an electrode is formed at an end of the redundant conductive connecting line, wherein the connecting the standby light-emitting element to the redundant conductive connecting line comprises:
providing the standby light-emitting element; and
connecting the standby light-emitting element to the electrode and forming an electrical connection.

5. The method according to claim 1, further comprising removing the light-emitting element with abnormal function.

6. A display panel, having a conductive layer comprising a conductive connecting line for electrically connecting with a light-emitting element, wherein the conductive layer further comprises:
a redundant conductive connecting line disconnected from the conductive connecting line through a spacer, the redundant conductive connecting line being configured for connecting a standby light-emitting element, wherein the redundant conductive connecting line is electrically connected to the conductive connecting line when the light-emitting element is abnormal, and a standby light-emitting element is connected to the redundant conductive connecting line to replace the light-emitting element with abnormal function.

7. The display panel according to claim 6, wherein an insulating medium is formed between the conductive connecting line and the redundant conductive connecting line;
wherein the conductive connecting line and the redundant conductive connecting line are interleaved through the insulating medium so that the insulating medium corresponding to an interleaved position forms a spacer, wherein the spacer is capable of being melted by laser, and the redundant conductive connecting line is electrically connected to the conductive connecting line.

8. The display panel according to claim 6, wherein the redundant conductive connecting line is formed with a connecting position for the standby light-emitting element, wherein the display panel is provided with a plurality of pixel units, wherein each pixel unit is provided with a plurality of the light-emitting elements and at least one connecting position for the standby light-emitting element, wherein the connecting position for the standby light-emitting element is connected to the standby light-emitting element to replace the light-emitting element with abnormal function when one of the light-emitting elements is abnormal.

9. The display panel according to claim 8, wherein the connecting position for the standby light-emitting element is disposed between at least two of the light-emitting elements, enabling at least two of the light-emitting elements to share the connecting position for the standby light-emitting element.

10. The display panel according to claim 6, wherein the conductive connecting line connecting to the light-emitting element with abnormal function is cut to be disconnected from a driving element.

11. The display panel according to claim 6, wherein the light-emitting element is a micro LED for emitting red, blue or green light.

12. A display panel, comprising:
a light-emitting element; and
a conductive layer having a conductive connecting line for connecting the light-emitting element, and provided with a redundant conductive connecting line for connecting a standby light-emitting element, wherein when the light-emitting element is detected to be abnormal, the redundant conductive connecting line is electrically connected to the conductive connecting line, and the standby light-emitting element is connected to the redundant conductive connecting line to replace the light-emitting element with abnormal function;
wherein the redundant conductive connecting line is disconnected from the conductive connecting line through a spacer, and the spacer is melted by laser when the light-emitting element is detected to be abnormal, so that the redundant conductive connecting line on either side of the spacer is electrically connected with the conductive connecting line on another side of the spacer.

13. The display panel according to claim 12, wherein the conductive layer comprises a first conductive layer provided with a plurality of conductive connecting lines and a second conductive layer provided with the redundant conductive connecting line, wherein the redundant conductive connecting line is interleaved with the conductive connecting line.

14. The display panel according to claim 13, wherein an isolation layer is formed on the first conductive layer, and the second conductive layer is formed on the isolation layer.

15. The display panel according to claim 14, wherein the isolation layer is melt by laser at an interleaved position of the conductive connecting line and the redundant conductive connecting line when the light-emitting element is abnormal.

16. The display panel according to claim 12, wherein the conductive connecting line connecting to the light-emitting element with abnormal function is cut to be disconnected from a driving element.

17. The display panel according to claim 12, wherein a connecting position of the standby light-emitting element is disposed between at least two of the light-emitting elements, enabling at least two of the light-emitting elements to share the connecting position for the standby light-emitting element.

18. The display panel according to claim 12, wherein the display panel is provided with a plurality of pixel units, each of which is provided with a plurality of the light-emitting elements and at least one connecting position for the standby light-emitting element, wherein the light-emitting element is a micro LED for emitting red, blue or green light.

* * * * *